United States Patent Office 3,272,661

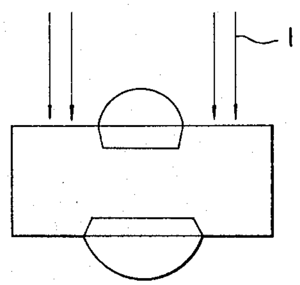
INVENTORS
Masami Tomono
Hiroshi Kodera
Hiroshi Ueda
BY
ATTORNEY

Patented Sept. 13, 1966

3,272,661

MANUFACTURING METHOD OF A SEMI-CONDUCTOR DEVICE BY CONTROLLING THE RECOMBINATION VELOCITY

Masami Tomono, Hiroshi Kodera, and Hiroshi Ueda, Tokyo, Japan, assignors to Hitachi, Ltd., Tokyo, Japan, a corporation of Japan Filed July 16, 1963, Ser. No. 295,490
Claims priority, application Japan, July 23, 1962, 37/30,250
1 Claim. (Cl. 148—1.5)

The present invention relates to a novel manufacturing method of semi-conductor devices.

Junction transistors, diodes, rectifiers or the like which have hitherto been widely used utilize minority carriers which were injected from one region to the other through a PN junction or a barrier at the metal-semi-conductor contact. Minority carriers which were injected in excess of the concentration at thermal equilibrium recombine with majority carrier through various causes. The velocity at which minority carriers recombine is called the recombination velocity and has a connection with mean life of minority carriers from generation to recombination and the mean distance which minority carriers travel during the mean life and it is a major factor which controls the characteristics of transistors and diodes. Minority carriers recombine through recombination centers which exist on the surface or interior of semi-conductor material constituting a semi-conductor device. Therefore, the recombination velocity may be controlled by proper selection of species of the recombination center and also by controlling its concentration. There have been several methods known to control the recombination velocity. One of them is to introduce a certain impurity element, which has a large probability for the capture of minority carriers, to a desired concentration. In this case, copper for germanium and gold for silicon was used. These impurity elements were introduced by adding them to the melt during the growth of a single crystal or by diffusing them into the crystal at elevated temperatures. Another method is to introduce dislocations by plastic deformation, for example by bending at high temperatures because dislocations act as recombination centers. Further, the surface recombination velocity depends on the surface condition of the material, so, for example, the surface recombination velocity of germanium is increased by oxidizing germanium surface in air at the temperature of about 100° C.

Such conventional methods used to control the recombination velocity had, however, the following drawbacks. In the first place, impurities could not be made to distribute in the desired portion of the semi-conductor base material. As for the first method where impurities are added to the crystal during the growth from the melt, recombination centers are introduced throughout the crystal. Moreover, if the crystal is grown by the Czochralski method which are currently used as a method of growing semi-conductor crystals, macroscopically inhomogeneous distribution of recombination centers is liable to occur in the crystal due to the segregation of impurities. As for the second method where such impurities are introduced by diffusion, recombination centers will be introduced from the whole surface of the material, thus the localized addition of impurities in the direction perpendicular to the direction of diffusion could not be performed unless an elaborate technique, such as masking by oxide, was not used. Moreover, although impurities of small diffusion coefficient could be introduced in the thin layer near the surface, unfortunately, however, impurities which are effective as recombination centers have usually a large diffusion coefficient, so they tend to spread throughout the material. In the second place, since the heating effect extends over the whole region of the sample, desired impurities could not be introduced into a semi-conductor element which has a finished junction structure, because change of internal structure will be caused and accordingly undesired degradation of its characteristics are induced. In the third place, as for the method of changing the surface recombination velocity by a surface treatment, the surface recombination velocity would be affected by a rapid change of external condition, because the change was only in the surface condition.

It is one object of the present invention to provide an improved method for controlling the recombination velocity in a semi-conductor through controlled heating by an electron beam.

If an electron beam is used as the heating method, it is possible to heat the specimen to any size and depth by controlling accelerating voltage, electron current and its pulse rate.

The drawing illustrates what is set out in detail in the specification.

If the recombination velocity in a semi-conductor is controlled by using an electron beam heating, the following method can be used. The first method is to utilize the thermal conversion phenomenon which is particularly remarkable in germanium. In the case of germanium, this is considered to occur through the unwilling introduction of copper. In an extreme case, the conductivity type of germanium will be transformed from N-type to P-type. Copper has been known to become effective recombination centers in germanium. Similar phenomenon may be seen also in the case of silicon and the lowering of minority carrier lifetime is often found after heat treatment. The second method is to coat a semi-conductor base material with impurities, which become recombination centers, by plating, evaporation or the like and to heat any desired portion thus introducing impurities into the semi-conductor. The third method is to confine vacancies in the crystal lattice which were produced in the desired portion of a sample by heating it using an electron beam, in other words to quench a sample after heating it a sufficient time to attain the thermal equilibrium condition. Vacancies also are effective as recombination centers. The following phenomena are used as the fourth method to reduce the recombination velocity. In most cases, impurities which become recombination centers decrease their solid solubility as the temperature decreases. The concentration of vacancies in a thermal equilibrium state also decreases as the temperature is lowered. When a desired portion of a semi-conductor base material containing a number of recombination centers is heated up to an appropriate temperature, recombination centers will precipitate and become inactive or disappear thus raising the recombination velocity of the said region. When copper is used as recombination centers in germanium, it is possible to precipitate them by annealing the sample at the temperature between 400° C. and 500° C. The temperature is determined by solid solubility and diffusion coefficient of recombination centers.

The method of the present invention has the following advantages: Firstly, it is possible to make localized regions of any shape, size and depth to have the different recombination velocities from that in other regions, because the heating effect of electron beam can be confined to the desired portion. Secondly, by the present method the change in the property occurs in the interior of the semi-conductor material near its surface, the change is stable in contrast to a conventional method where only the surface condition is changed by the surface treatment and also its characteristics changes sensitively by the introduction of such recombination centers. Thirdly, since only the desired portion is heated, it is possible to change the recombination velocity in the semi-conductor element after its main parts such as junction structures have been formed. Therefore, it is possible to monitor the change of the characteristics of a semi-conductor device during the heat treatment procedure. This special feature endows the present invention with a remarkable advantage that its characteristics has become to be controlled easily with high reproducibility by the above method.

Thus, the method of the present invention comprises the following steps: Placing a semi-conductor specimen, in which a major part was already completed, in a vacuum chamber of an electron beam working apparatus. Then, a predetermined region on the said semi-conductor specimen is heated to a predetermined temperature by irradiating a focused electron beam of a predetermined energy. A certain characteristic of the said semi-conductor specimen is monitored during the working, which depends on the recombination velocity of minority carriers in the semi-conductor body, whereby a semi-conductor device of desired characteristics is obtained.

Next, the present invention shall be explained by its preferred embodiment. An alloy junction type germanium transistor was prepared by alloying indium to an N-type germanium base pellet from both sides. After the pellet was mounted on the stem and suitable lead connections were made, any imperfect portion of the junction was removed by electro-polishing. The current amplification factor of the transistor was 200 under the bias condition where collector-to-base reverse voltage was −6 V. and emitter current was 3 ma. An annular band of 50 $\mu$ wide along the periphery of the alloyed emitter junction of 0.6 mm. in diameter was irradiated by an electron beam which had been accelerated at 30 kv. and the current of which was 30 $\mu$a. The said part was heated to 800° C. for 5 minutes. By this treatment, the current amplification factor was decreased as low as 80 under the same bias condition. Since only the localized region was irradiated by the electron beam during the above treatment, any change in the internal structure of the transistor was not obtained because the fusion of indium or the like cauld be avoided. Therefore, it is possible to change the current amplification factor only by changing its recombination velocity without affecting other characteristics.

Silicon diodes are often used as switching diodes. Minority carrier lifetime is relatively long in the high resistivity side of two regions of a PN junction and the response to an electric pulse is mainly determined by the lifetime of the region. In other words, when the lifetime is long, injected carriers are not collected immediately when the bias applied to the diode was switched from forward to reverse direction, so a considerable current will flow for a time depending upon its lifetime. In order to switch the diode from the on-state to the off-state in a short time, it is desirable that the lifetime is short in the region corresponding to a large recombination velocity. On the other hand, a low recombination velocity is desirable in the low resistivity side to make the injection efficiency large. Such conditions will be satisfied simultaneously only by using the method of the present invention. The present invention operates in the following manner:

A grown junction type silicon diode was an N-type region of resistivity of 10 ohm-cm. and a P-type region of resistivity of 0.01 ohm-cm. The lifetime of the N-type region was 60 microseconds and that of the P-type region was 3 microseconds. The N-type region of the above diode was irradiated by an electron beam which has been accelerated by a voltage of 50 kv. and the current of which was 30 microamperes. After the region was heated to 1200° C., the lifetime of that region was decreased to 0.1 microsecond. The diode produced by this method may be used up to the repetition rate of 10 mc.

While a preferred embodiment of the novel method as well as a numerical example thereof, have been described in detail hereinbefore, it will be obvious to those skilled in the art that various changes and modifications may be made therein without departing from the invention and, therefore, it is intended in the appended claim to cover all such change and modifications which fall within the true spirit and scope of the present invention.

We claim:

A manufacturing method of semi-conductor devices, wherein the recombination velocity in the vicinity of a semi-conductor surface comprises the steps of
- irradiating a semi-conductor specimen, in which the major part is already completed, with a focused electron beam at the position which can affect the recombination velocity, and
- monitoring a predetermined characteristic of said semi-conductor specimen which depends on the recombination velocity of minority carriers in the semi-conductor body, so as to obtain a semi-conductor device of controlled characteristics.

References Cited by the Examiner

UNITED STATES PATENTS

| | | | |
|---|---|---|---|
| 2,793,282 | 5/1957 | Steigerwald | 148—1.5 |
| 3,206,336 | 9/1965 | Hora | 148—1.5 |

HYLAND BIZOT, *Primary Examiner.*